US007940373B2

(12) United States Patent
Suh et al.

(10) Patent No.: US 7,940,373 B2
(45) Date of Patent: May 10, 2011

(54) COMPENSATING MASKS, MULTI-OPTICAL SYSTEMS USING THE MASKS, AND METHODS OF COMPENSATING FOR 3-D MASK EFFECT USING THE SAME

(75) Inventors: Sung-soo Suh, Yongin-si (KR); Suk-joo Lee, Yongin-si (KR); Han-ku Cho, Seongnam-si (KR); Yong-jin Chun, Daejeon (KR); Sung-woo Lee, Suwon-si (KR); Young-chang Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 613 days.

(21) Appl. No.: 11/925,014

(22) Filed: Oct. 26, 2007

(65) Prior Publication Data

US 2008/0106719 A1    May 8, 2008

(30) Foreign Application Priority Data

Nov. 2, 2006    (KR) .................. 10-2006-0107947

(51) Int. Cl.
*G03B 27/52*    (2006.01)
*G03B 27/72*    (2006.01)
*G03B 27/32*    (2006.01)

(52) U.S. Cl. .................. 355/55; 355/71; 355/77

(58) Field of Classification Search .................. 355/52, 355/53, 55, 71, 77; 430/5, 20, 30, 311; 250/548
See application file for complete search history.

(56) References Cited

U.S. PATENT DOCUMENTS

| 6,163,367 | A  | * | 12/2000 | Obszarny | .................. 355/53 |
| 6,835,507 | B2 | * | 12/2004 | Ki et al. | .................. 430/5 |
| 2007/0000884 | A1 | * | 1/2007 | Salama | .................. 219/121.68 |

FOREIGN PATENT DOCUMENTS

| JP | 2004-246223 A | 9/2004 |
| KR | 1020060075099 A | 7/2006 |

\* cited by examiner

*Primary Examiner* — Hung Henry Nguyen
(74) *Attorney, Agent, or Firm* — Myers Bigel Sibley & Sajovec (57) ABSTRACT

Provided are a compensating mask, a multi-optical system using the compensating mask, and a method of compensating for a 3-dimensional (3-D) mask effect using the compensating mask. Methods of compensating for a 3-D mask effect using a compensating mask may include generating a first kernel corresponding to a normal mask used for forming a minute pattern, generating a second kernel corresponding to a compensating mask, mixing the first kernel corresponding to the normal mask with the second kernel corresponding to the compensating mask, and generating a multi-optical system kernel corresponding to mixing the first kernel and the second kernel.

5 Claims, 11 Drawing Sheets

P, system
=optics ⊗ normal_mask
(trans, phase)

P, compensator
=optics ⊗ compensator_mask
(trans, phase)

COMPENSATING MASKS, MULTI-OPTICAL SYSTEMS USING THE MASKS, AND METHODS OF COMPENSATING FOR 3-D MASK EFFECT USING THE SAME

CROSS-REFERENCE TO RELATED PATENT APPLICATION

This application claims the benefit of Korean Patent Application No. 10-2006-0107947, filed on Nov. 2, 2006, in the Korean Intellectual Property Office, the disclosure of which is incorporated herein in its entirety by reference.

BACKGROUND OF THE INVENTION

The present invention relates to apparatus, systems and methods for fabricating a semiconductor device, and more particularly to, masking in a semiconductor fabricating process.

Semiconductors have become highly integrated and, as such, the component dimensions have become increasingly minute. Thus, there may be increased demand for mask pattern resolution to accommodate pattern dimensions that may be less than the wavelength of light used in an exposure apparatus.

Optical proximity correction (OPC) technology may be used to correct the shape of a mask pattern that may experience deformation caused by an optical proximity effect for a pattern having a shorter line width than the wavelength of light. Examples of OPC technology include, for example, model-based OPC and rule-based OPC. Model-based OPC can be more easily applied to various layouts than in rule-based OPC.

A current sub-50 nm device process may need a pattern scale of a mask of about 4 times, i.e. below 200 nm. However, a mask of this size may have a narrow structure, which may not be easily penetrated by an ArF laser used as a light source. As a result, internal scattering, mask induced polarization, and reflection loss due to pellicle may cause a 3-dimensional (3-D) mask effect.

Rigorous simulations may be performed to compensate for the 3-D mask effect, such as finite difference time domain (FDTD) analysis, rigorous coupled wave analysis (RCWA), and time-domain electromagnetic massively parallel evaluation of scattering from topography (TEMPEST) as a kind of FDTD. However, the rigorous simulations may be difficult to apply when OPC is performed over a large area. Further, such rigorous simulations may not give significantly better results than conventional simulations.

Figure 1:
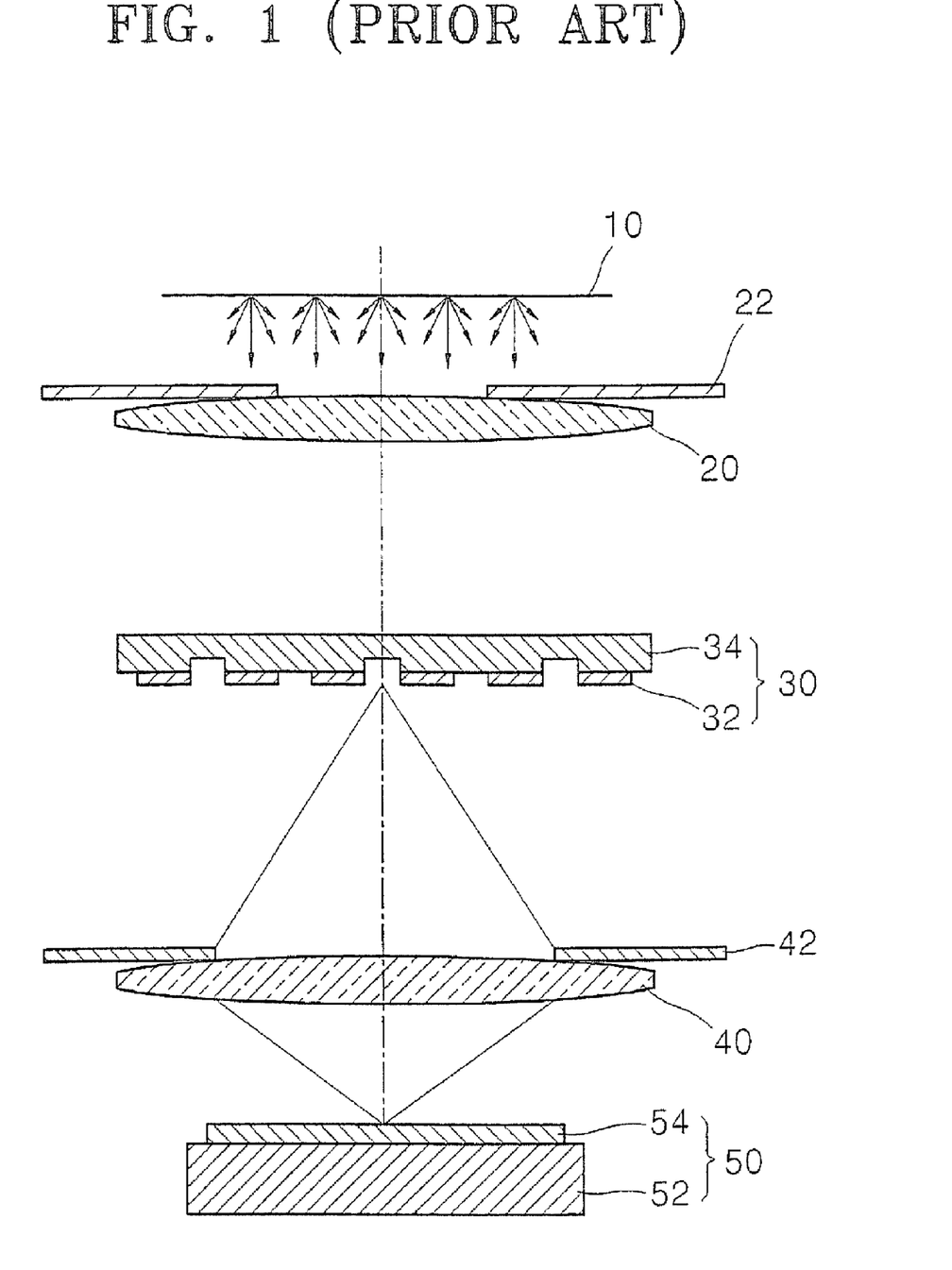
FIG. 1 is a side cross-sectional diagram that schematically illustrates a scanner system for photolithography.

Reference is made to FIG. 1, which schematically illustrates a typical scanner system that may be used in photolithography. The scanner system includes a light source 10, an illumination lens 20, a mask 30, and a projection lens 40, among other components. An illumination pupil 22 may be formed on the illumination lens 20, and an imaging pupil 42 may be formed on the projection lens 40 to correct a pupil surface. A wafer 50, on which a pattern is to be formed, may include a resist layer 54 coated onto a silicon substrate 52. The wafer 50 may be placed under the scanner system and light may be irradiated onto the resist layer 54. Here, the mask 30 may include a light blocking layer 32 formed of chromium (Cr) and a light transmitting layer 34 formed of quartz. The silicon substrate 52 may be a pure silicon substrate or a silicon substrate on which multiple material layers have been formed.

A conventional mask may approximate a thin mask and OPC may be performed without considering the mask's thickness. However, the accuracy of a thin mask approximation may be lower when the feature size or pattern size of the mask approaches the wavelength of the light source, e.g. an ArF wavelength. In other words, in a current thin mask approximation method, mask Features are effective at above 2.5× the light source wavelength. Three-dimensional (3-D) mask effects, however, may occur below that size. In this regard it may be difficult to adopt the thin mask approximation method.

Figure 2A:
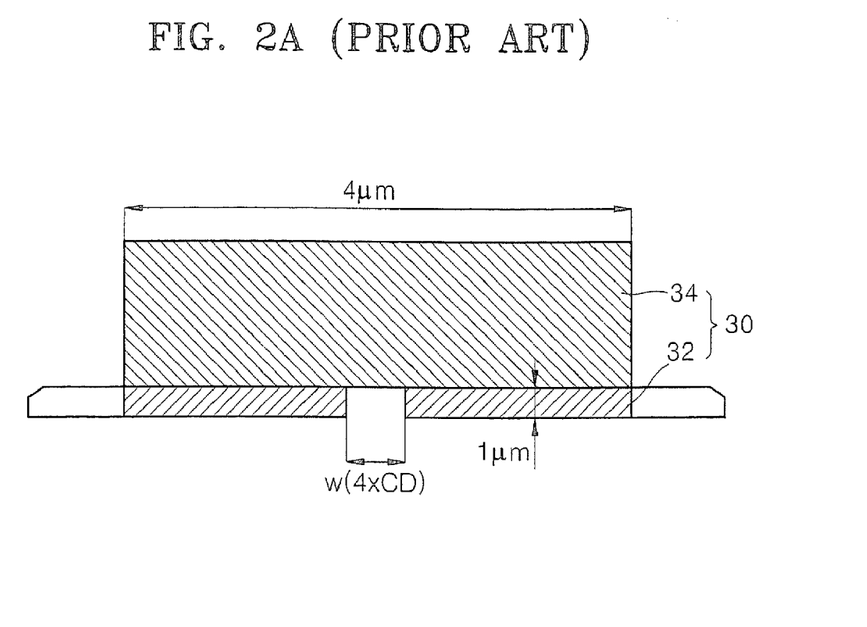
FIGS. 2A and 2B are a cross-sectional view and a graph illustrating a 3-dimensional (3-D) mask effect with respect to a reduction in a pattern pitch of a mask.

Reference is made to FIG. 2A, which is a cross-sectional view of a portion of a mask 30. The mask 30 may include a light transmitting layer 34 formed of glass and a light blocking layer 32 formed of chromium (Cr) underneath the light transmitting layer 34. Patterns may be formed in the light blocking a layer 32 to form openings of width W. Although one opening is illustrated by way of example, a mask 30 may include multiple openings corresponding to a pattern. Such an opening may generally have a width of about four times the pitch or line width of a wafer pattern.

Figure 2B:
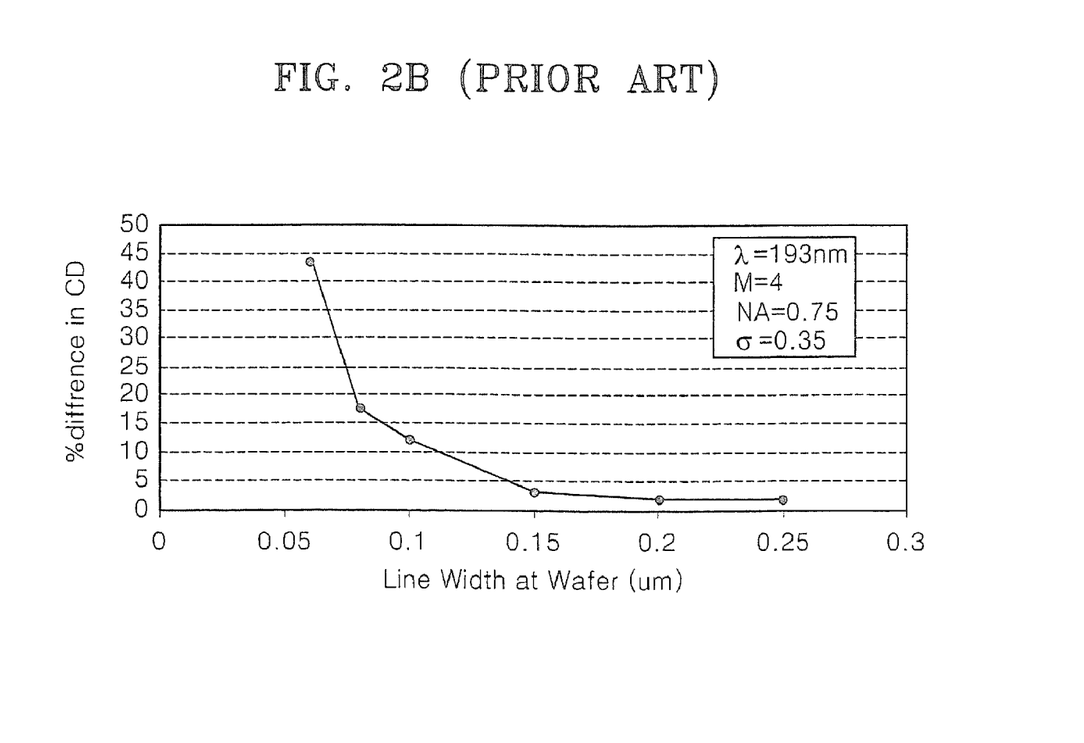

Reference is now made to FIG. 2B, which is a graph of percent difference of a critical dimension (CD) of a wafer as a function of the width of an opening of a light blocking layer 32, as illustrated in FIG. 2A. The x-axis denotes the line width of a wafer pattern, and the y-axis denotes the percent difference of the CD. By way of example, the light source has a wavelength of 193 nm, the numerical aperture (NA) is 0.75, and the coherence coefficient σ is 0.35. Reference character M denotes the size factor of the opening of the mask 30 with respect to the line width of the wafer. Here, the factor M is "4." As illustrated, the difference of the CD, which may also be referred to as error, increases abruptly at line widths below 150 nm. This can be attributed to inaccuracies in OPC which does not account for a 3-D mask effect as described above.

SUMMARY OF THE INVENTION

The present invention provides a mask that includes a compensating mask in a thin mask pattern configured to compensate for a 3-D (3-dimensional) effect caused by the thickness of a normal mask used for forming a minute pattern. Some embodiments of a compensating mask may include a light transmitting layer formed of a light transmitting, material; and a light blocking layer patterned underneath the light transmitting layer and formed of a light blocking material.

In some embodiments, a weighting function of the compensating mask corresponds to a scattering coefficient α of a near field image of the normal mask. In some embodiments, the weighting function is used to mix a first kernel of the normal mask with a second kernel of the compensating mask so as to generate a multi-optical system kernel. In some embodiments, the multi-optical system kernel is applied on a wafer and a result measured on the wafer is compared with a desired pattern specification to calibrate the scattering coefficient α and the weighting function.

Some embodiments provide that standard optical parameters and a pupil surface function of a projection lens positioned under a mask of an optical system are calibrated to generate the first kernel of the normal mask and the second kernel of the compensating mask. In some embodiments, the standard optical parameters include an illumination condition, an NA (numeral aperture), and a wavelength, and the pupil surface function includes a magnitude and a phase of light as factors.

Some embodiments of the present invention include computer program products that may include a computer usable storage medium having computer-readable program code embodied in the medium, the computer readable program code configured to generate a kernel of the compensating mask of embodiments described herein.

Some embodiments of the present invention include a multi-optical system that may include a light source configured to irradiate light, an illumination lens configured to calibrate the irradiated light, and a normal mask configured to transfer a predetermined minute pattern onto a wafer via the calibrated light. Such embodiments may further include a compensating mask formed in a thin mask pattern to compensate for a 3-D (3-dimensional) effect caused by the thickness of a normal mask, the compensating mask including a light transmitting layer formed of a light transmitting material and a light blocking layer patterned underneath the light transmitting layer and formed of a light blocking material and a projection lens focusing the light transmitted through the mask onto the wafer.

In some embodiments, an image pupil surface is formed on the projection lens. In some embodiments, a first kernel corresponding to the normal mask is mixed with a second kernel corresponding to the compensating mask in the multi-optical system to generate a multi-optical system kernel. In some embodiments, standard optical parameters and a pupil surface function of the projection lens positioned under a mask of an optical system are calibrated to generate the kernels of the normal and the compensating mask. In some embodiments, the multi-optical system kernel is formed according to a weighting function of the second kernel corresponding to the compensating mask.

In some embodiments, the weighting function corresponds to a scattering coefficient α of a near field image of the normal mask. In some embodiments, the multi-optical system kernel is applied on a wafer, and a result measured on the wafer is compared with a desired pattern specification to calibrate the scattering coefficient α and the weighting function. In some embodiments, the pupil surface function is calibrated according to the weighting, function to generate the multi-optical system kernel.

Some embodiments of the present invention include methods of compensating for a 3-D mask effect using, a compensating mask. Some embodiments of such methods may include generating a first kernel corresponding to a normal mask used for forming a minute pattern generating a second kernel corresponding to a compensating, mask and mixing the first kernel corresponding to the normal mask with the second kernel corresponding to the compensating mask. Such methods may further include generating a multi-optical system kernel corresponding to mixing the first kernel and the second kernel.

Some embodiments may include calibrating standard optical parameters and a pupil surface function of a projection lens positioned under a mask of an optical system to generate the first kernel and the second kernel corresponding to the normal and the compensating masks, respectively. In some embodiments, the standard optical parameters include an illumination condition, an NA (numerical aperture), and a wavelength, and wherein the pupil surface function comprises a magnitude and a phase of light as factors.

Some embodiments may include forming the multi-optical system kernel according to a weighting function of the kernel of the compensating mask. Some embodiments include applying the multi-optical system kernel on a wafer and comparing a result measured on the wafer a desired pattern specification to calibrate the weighting function. In some embodiments, the weighting function corresponds to a scattering coefficient α of a near field image of the normal mask.

In some embodiments, generating the multi-optical system kernel includes calibrating the pupil surface function according to the weighting function. In some embodiments, generating the multi-optical system kernel includes inputting a predetermined value to the scattering coefficient α to obtain the weighting function, applying the weighting function to mix the first kernel corresponding to the normal with the second kernel corresponding to the compensating mask, and applying the multi-optical system kernel on a wafer to measure a result. Such embodiments may further include comparing the measured result with a desired pattern specification, calibrating the scattering coefficient α according to the comparison to obtain a new weighting function, and applying the new weighting function to mix the first kernel corresponding to the normal mask with the second kernel corresponding to the compensating mask.

Some embodiments include performing OPC (optical proximity correction) before generating the kernel of the normal mask and the kernel of the compensating mask. Some embodiments include reflecting restriction conditions according to a specific pattern of the wafer after generating the multi-optical system kernel. Some embodiments include performing calibration so that the multi-optical system is applied to a defocused 3-D model after generating the multi-optical system kernel. In some embodiments, the methods may be applied to a mask scale of 200 nm or less.

DETAILED DESCRIPTION OF THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

In the figures, the dimensions of structural components, including layers and regions among others, are not to scale and may be exaggerated to provide clarity of the concepts herein. It will also be understood that when a layer (or layer) is referred to as being 'on' another layer or substrate, it can be directly on the other layer or substrate, or can be separated by intervening layers. Further, it will be understood that when a layer is referred to as being 'under' another layer, it can be directly tinder, and one or more intervening layers may also be present. In addition, it will also be understood that when a layer is referred to as being 'between' two layers, it can be the only layer between the two layers, or one or more intervening layers may also be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having, a meaning that is consistent with their meaning in the context of the relevant art and will not be interpreted in an idealized or overly formal sense unless expressly so defined herein.

The present invention may be embodied as apparatus, systems, methods, and/or computer program products. Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

The present invention is described herein with reference to flowchart and/or block diagram illustrations of methods, systems, and computer program products in accordance with exemplary embodiments of the invention. It will be understood that each block of the flowchart and/or block diagram illustrations, and combinations of blocks in the flowchart and/or block diagram illustrations, may be implemented by computer program instructions and/or hardware operations. These computer program instructions may be provided to a processor of a general purpose computer, a special purpose computer, or other programmable data processing apparatus to produce a machine, such that the instructions, which execute via the processor of the computer or other programmable data processing apparatus, create means for implementing the functions specified in the flowchart and/or block diagram block or blocks.

These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

Figure 3A:
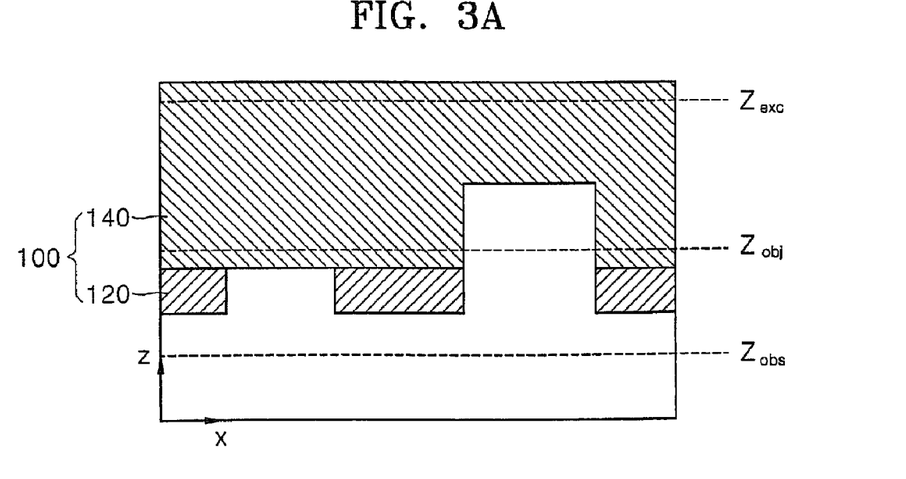
FIGS. 3A through 3C are a partial cross-sectional view of a normal mask and graphs illustrating a light transmitting shape according to a position of the normal mask according to some embodiments of the present invention.
Figure 3B:
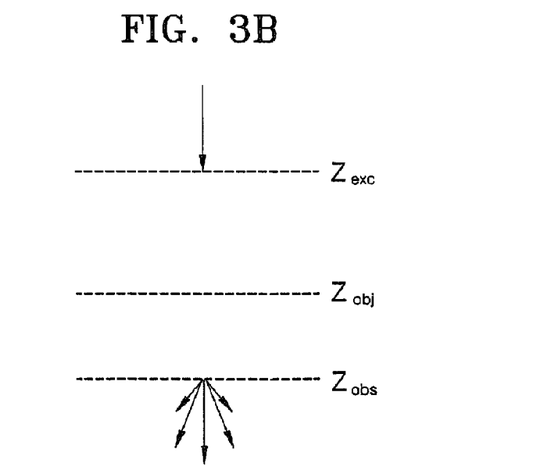
Figure 3C:
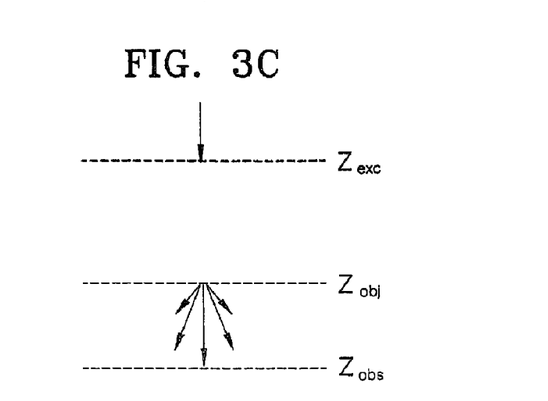

Reference is now made to FIGS. 3A through 3C, which are a partial cross-sectional view of a normal mask and graphs illustrating a light transmitting shape according to a position of the normal mask according to some embodiments of the present invention. Referring to FIG. 3A, which is a partial cross-sectional view of a normal mask 100, the normal mask 100 includes a light transmitting layer 140 above a light blocking layer 120. The light transmitting layer 140 may be formed of a variety of light transmitting materials including, for example, glass and/or quartz, among others. The light blocking layer 120 includes patterns having openings and may be formed of a metal including, for example, chromium (Cr). The normal mask 100 may be a phase shift mask (PSM), which is formed by alternately etching portions of the light transmitting layer 140 on adjacent openings of the light blocking layer 120.

In some embodiments, an image formed in a portion adjacent the normal mask 100 after light has passed through the normal mask 100 may be called a near field image 100. If the feature size and/or pattern size of the normal mask 100 is larger the normal mask 100 may accurately approximate a thin mask. That is, the near field images of the normal and the thin mask may be similar to each other. However, as the mask feature size decreases, a 3-D mask effect may occur due to diffraction caused by the thickness of the normal mask 100. As a result, the normal mask 100 may not accurately approximate a thin mask. For example, high-order diffracted light beams may be reflected on a near field image, which may vary depending on a position of the normal mask 100. As a result, the normal mask 100 may not approximate the thin mask.

$Z_{exe}$ denotes a portion on which light is incident, $Z_{obj}$ denotes a portion of the opening for measuring a near field image of an etched portion of the light transmitting layer 140, and $Z_{obs}$ denotes a portion for measuring a near field image of a mask. Referring to FIG. 3B, which schematically illustrates a left portion of an opening transmitting light, light is incident on $Z_{exe}$ and then diffused from an opening portion, i.e. the portion $Z_{obs}$. Reference is now made to FIG. 3C, which illustrates an etched portion of the light transmitting layer 140, i.e. the portion $Z_{obj}$ of a right portion of the opening diffusing light. If the pattern size of the mask is large, field images in the portions $Z_{obj}$ and $Z_{obs}$ are similar to each other. However, if the pattern size of the mask is small, light beams diffused from the portion $Z_{obj}$ are diffracted when passing the opening. Thus, a different field image from a conventional field image is formed in the portion $Z_{obs}$.

Figure 4:
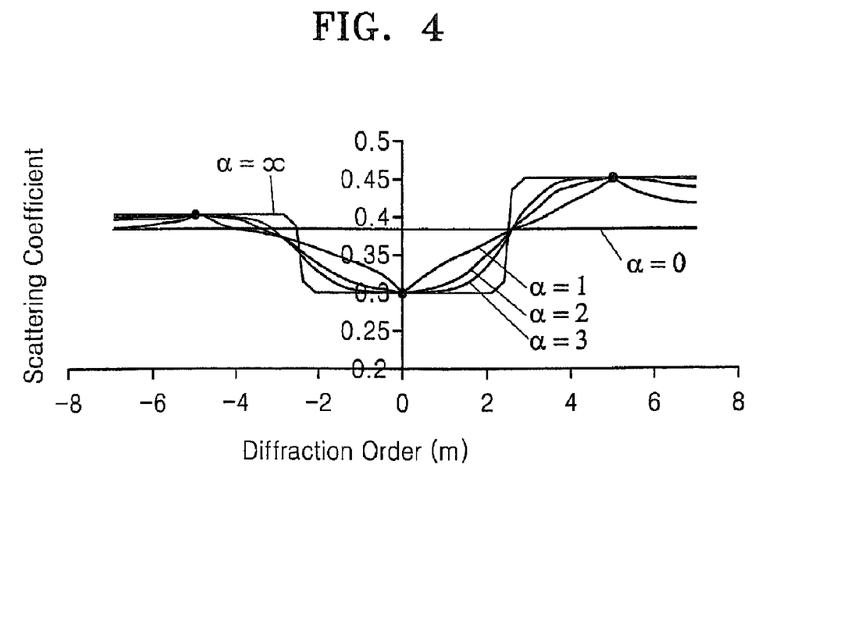
FIG. 4 is a graph of a near field image according to a scattering coefficient for obtaining a weighting function of a compensating mask according to some embodiments of the present invention.

Reference is now made to FIG. 4, which is a graph of a near field image according to a scattering coefficient for obtaining a weighting function of a compensating mask according to some embodiments of the present invention. The near field image is expressed according to the scattering coefficient $\alpha$. When the scattering coefficient $\alpha$ is infinite $\infty$, an optimal near field image is formed. When the scattering coefficient $\alpha$ is finite, an image is distorted by diffraction. In this regard, a compensating mask may be used to correct the distortion of the image caused by diffraction.

The compensating mask may be fabricated in the form of a thin mask. A kernel of the compensating mask may be generated and then mixed with a kernel of a normal mask to generate a kernel of an optical mask. In some embodiments, a kernel is a model expressed as a transfer function corresponding to an optical proximity effect through OPC. A difference between a mask pattern and a pattern transferred onto a wafer through the mask pattern may be obtained in advance using the kernel, and then the mask pattern may be corrected according to the result of a simulation.

When a kernel of the compensating mask is mixed with the kernel of the normal mask, a weight of the compensating mask should be included. In this manner, the extent to which a kernel of the compensating mask is to be reflected to effectively exclude a 3-D mask effect of the normal mask may be considered. Equation 1 of the weighting function expresses the weight of the compensating mask.

$$W_j = 1/|k_j - k_{sim,pq}|^\alpha \qquad (1)$$

wherein $\alpha$ denotes the scattering coefficient, and $k_j$ and $k_{sim,\,pq}$ denote space frequency vectors respectively corresponding to the portions $Z_{obj}$ and $Z_{obs}$ of FIG. 3. When the scattering coefficient $\alpha$ is infinite, the weighting function approaches 0, and no compensating mask may be used. In other words, when the scattering coefficient $\alpha$ corresponds to $\alpha = \infty$, the image may be distorted minimally as illustrated in FIG. 4.

The weighting function is a function of the space frequency vectors $k_j$, $k_{sim,\,pq}$, and the scattering coefficient $\alpha$. The space frequency vectors $k_j$ and $k_{sim,\,pq}$ may be directly obtained corresponding to a specific normal mask, and the scattering coefficient $\alpha$ may be substituted for a predetermined value and then appropriately adjusted. For example, if the pattern size of a wafer is 90 nm, "2" may be substituted for the scattering coefficient $\alpha$, and the weighting function may thus be determined. The kernel of the multi-optical mask is then generated and compared with a pattern size of the wafer, after which the scattering coefficient $\alpha$ may be changed. In this manner, the weighting function varies with the scattering coefficient $\alpha$. The kernel of the compensating mask may be approximately mixed with the kernel of the normal mask corresponding to the variation of the weighting function, to generate a multi-optical mask kernel.

Figure 5A:
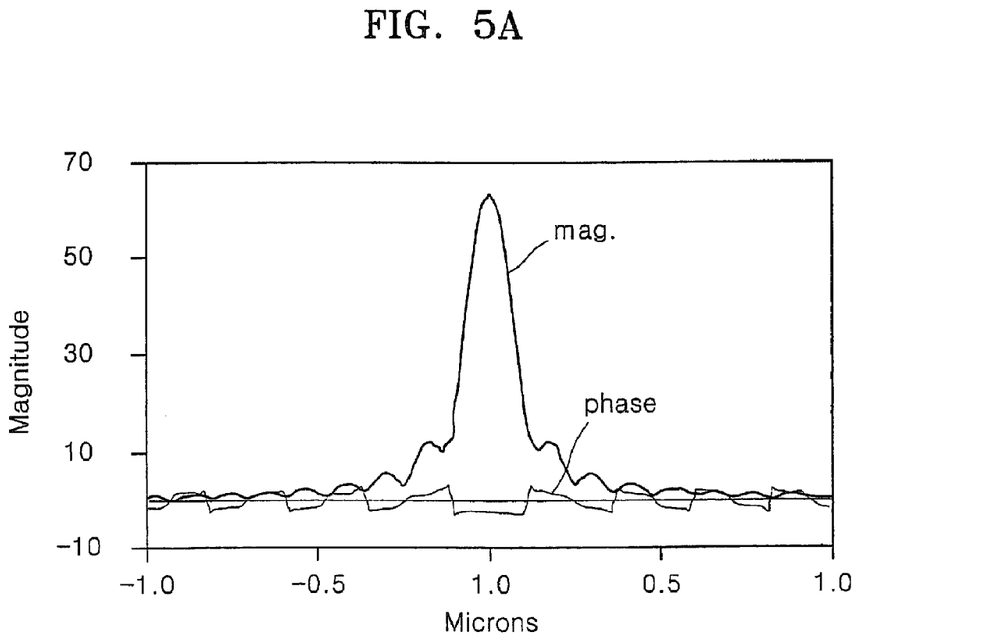
FIGS. 5A through 5C are graphs of pupil surface functions of a normal mask and a compensating mask and pupil surface functions corrected by the normal and compensating masks, according to some embodiments of the present invention.
Figure 5B:
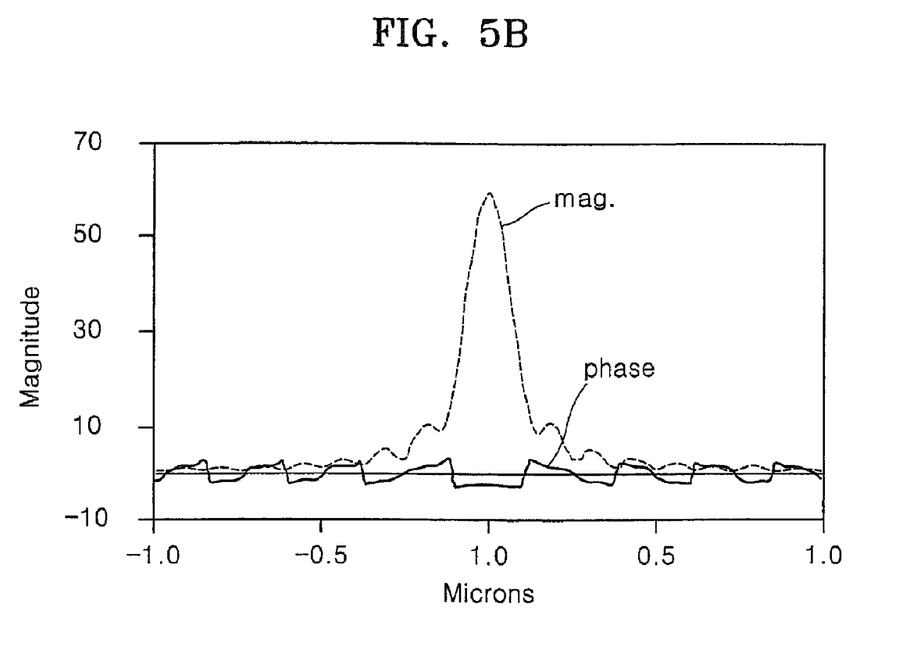
Figure 5C:
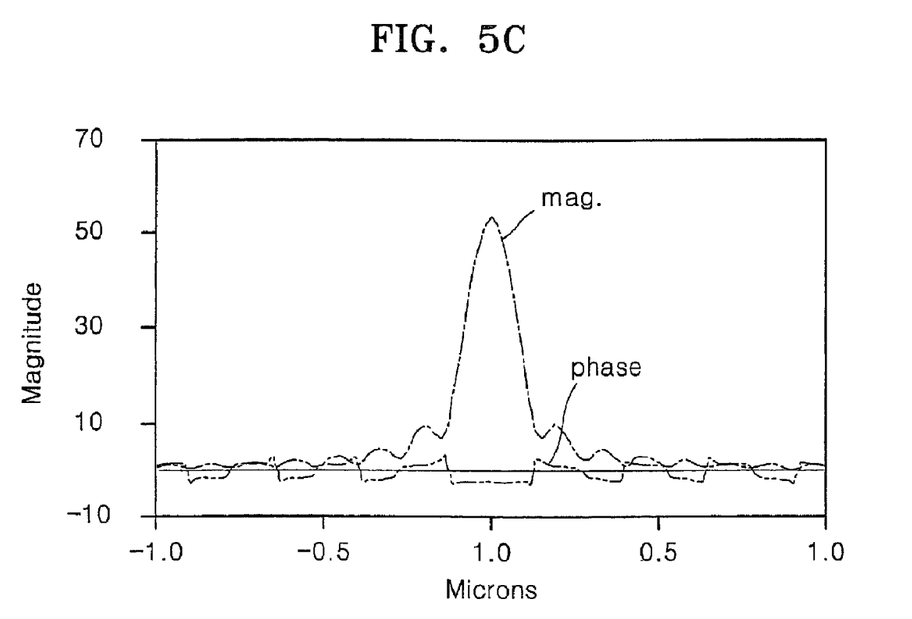
Figure 6:
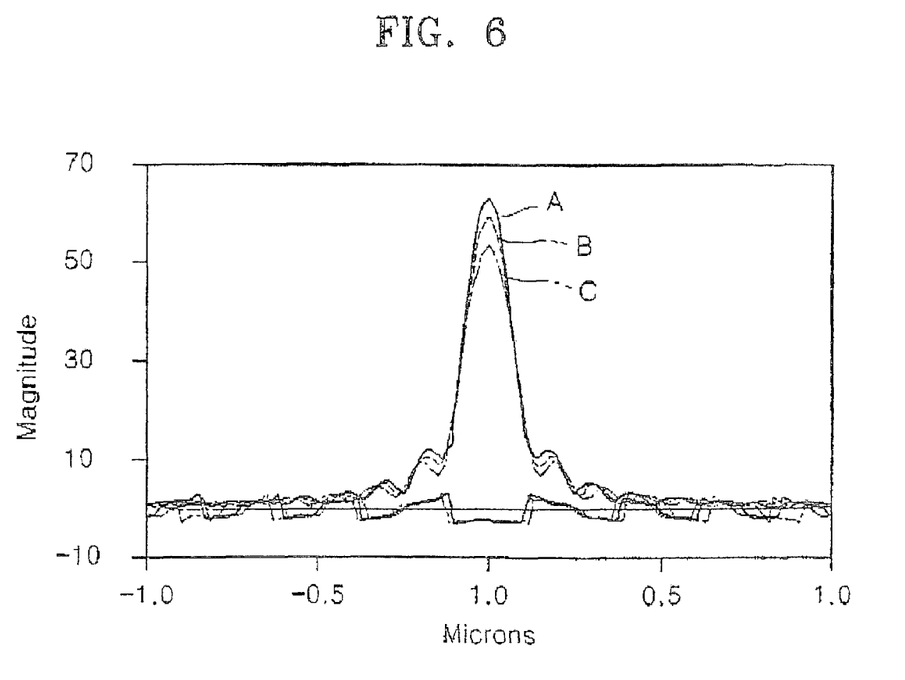
FIG. 6 is a composite graph showing the graphs of FIGS. 5A through 5C overlaid according to some embodiments of the present invention.

Reference is now made to FIGS. 5A and 5C, which are graphs of pupil surface functions of the normal and compensating masks, respectively, and FIG. 5B, which is a graph of a pupil surface function appropriately calibrated by reflecting the pupil surface functions of the normal and compensating masks, according to some embodiments of the present invention. Each of the graphs of FIGS. 5A through 5C illustrates the magnitude and phase of a pupil surface space. Additionally, reference is made to FIG. 6, which is a composite graph showing the graphs of FIGS. 5A through 5C overlaid. As illustrated in FIG. 6, A denotes the pupil surface function of the normal mask (FIG. 5A), C denotes the pupil surface function of the compensating mask (FIG. 5C), and B denotes the calibrated pupil surface function (FIG. 5B).

As shown in FIGS. 5A through 5C and 6, the effect of a high order diffracted light beam of the normal mask is reduced by the compensating mask. The magnitudes of $1^{st}$-order diffracted light beams to both sides centering on a $0^{th}$-order peak light beam are reduced. The calibration of the pupil surface function is used for mixing the kernels of the normal and compensating masks to generate the multi-optical mask kernel.

Figure 7:
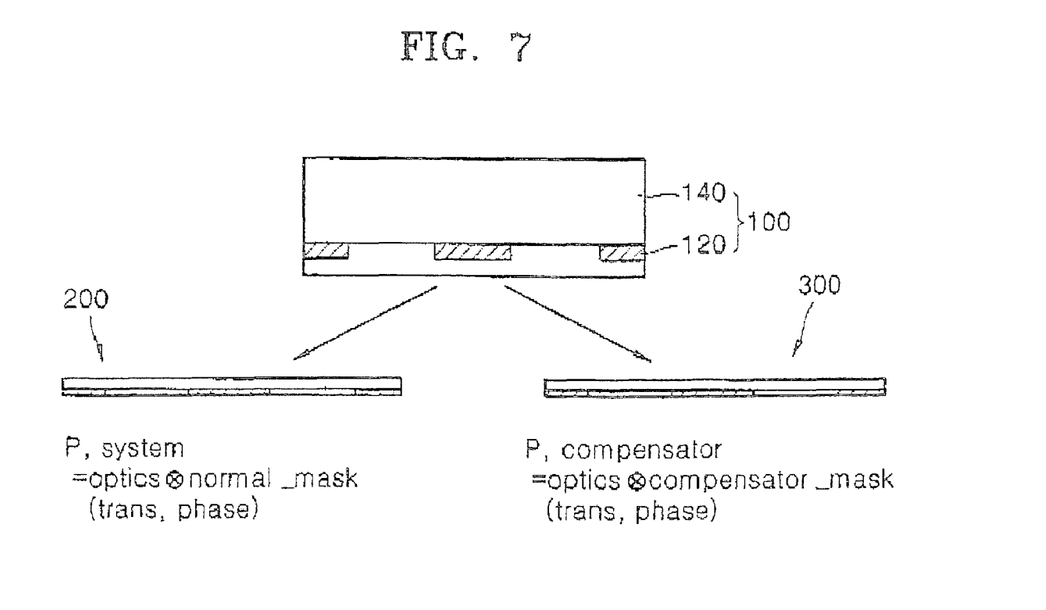
FIG. 7 shows an effect of a compensating mask for compensating for a 3-D mask effect in a multi-optical system according to some embodiments of the present invention.

Reference is made to FIG. 7, which shows the effect of a compensating mask for compensating for a 3-D effect in a multi-optical system according to some embodiments of the present invention. A normal mask 100 having a 3-D mask effect is represented as a mixture of a normal mask 200 and a compensating mask 300, wherein the mixture can approximate a thin mask. In this manner, the 3-D mask effect may be reduced and/or excluded. For example, a magnitude of the normal mask 100 having the 3-D mask effect may be expressed using Equations 2 and 3 below, such that Equation 3 is a Fourier Transform Equation of Equation 2. The effect of the compensating mask on a narrow feature or a narrow pattern size may be confirmed through a Fourier Transform of a periodic mask function of one dimension, in this case the x-axis.

$$m(x) = 1/p.rect(x/s) \otimes \mathrm{comb}(x/p) - \qquad (2)$$
$$\sqrt{T}.1/p.rect[(x-p/2)s] \otimes \mathfrak{J}\,\mathrm{comb}(x/p) -$$
$$\sqrt{T_{new}}.1/p.rect[(x-p/2)s] \otimes \mathrm{comb}(x/p)$$

$$\mathfrak{J}[m(x)] = 1 \bigg/ p.[[s.\sin(\pi k_x.s)/(\pi k_x.s)] - [ \qquad (3)$$
$$\omega\sqrt{T}.\sin(\pi k_x \omega)/(\pi k_x \omega).\exp(-\pi j k_x p)]].\sum_\infty^\infty \delta(k_x - n/p) -$$
$$1\bigg/p[\omega\sqrt{T_{new}}.\sin(\pi k_x \omega)/(\pi k_x \omega).\exp(-\pi j k_x p)].\sum_\infty^\infty \sigma(k_x - n/p)$$

The term including $\sqrt{T_{new}}$ reflects the effect of the compensating mask, p denotes a pitch, s denotes a pattern space, rect denotes a rectangular function, comb denotes δ function, ⊗ denotes a convolution computation, and T denotes a transmission coefficient. In general, if the magnitudes of the $0^{th}$-order and $1^{st}$-order diffracted light beams are confirmed, the effect of the compensating mask that corresponds to a reduction in the pitch may be confirmed. Approximation equations of the magnitudes of the $0^{th}$-order and $1^{st}$-order diffracted light beams can be expressed as Equations (4) and (5).

$$|MAG|_{0^{th}\_order} \approx s/p - \omega\sqrt{T}/p = [p - \omega(1+\sqrt{T}+\sqrt{T_{new}})]/p \quad (4)$$

$$|MAG|_{1^{st}\_order} \approx s/p \cdot \sin c(s/p) - \omega\sqrt{T}/p \cdot \sin c(\omega/p) - \omega\sqrt{T_{new}}/p \cdot \sin c(\omega/p) \quad (5)$$

In Equations (4) and (5), sin c denotes the function (sin x)/x. As shown in Equations (4) and (5), the effect of the compensating mask is increased with a reduction in the pitch p. In this regard, if a term of the compensating mask is not compensated for when the pitch p is small, an error increasingly occurs, causing the 3-D mask effect.

As a result, a proportion of a diffraction order is calibrated using the compensating mask. This calibration may be performed corresponding to scattering transmission loss, etc. of the mask on a pupil surface. In other words, the calibration may be performed through a diffraction order, electric field (E-field) matching, and/or the like on the pupil surface.

Figure 8:
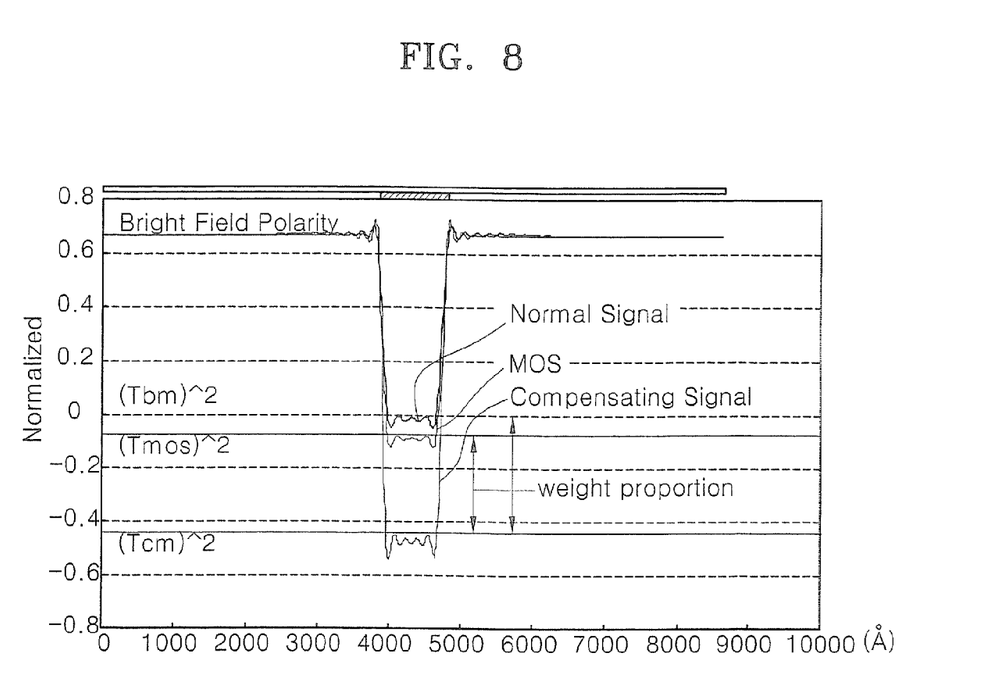
FIG. 8 is a graph showing the profile of a transmission electric field (E-field) on pupil surfaces of normal and compensating masks and the profile of a calibrated E-field according to some embodiments of a mask pattern in the multi-optical system of FIG. 7.

Reference is now made to FIG. 8, which is a graph showing, the profile of a transmission E-field on the pupil surfaces of the normal and compensating masks and the profile of a calibrated E-field according to a specific mask pattern in the multi-optical system of FIG. 7. Referring to FIG. 8, a proportion of an F-field or a signal is calibrated by calibrating a diffraction order on a pupil surface. In this manner, a profile of a filially calibrated E-field may be obtained as shown in FIG. 5. MOS denotes a modified (multiple) optical system and a weight proportion is equal to the above-described weighting function. In other words, in the MOS, an E-field of a normal mask is mixed with an E-field of a compensating mask according to the weight proportion to generate the profile of the finally calibrated E-field. The calibration of the E-field on the pupil surface corresponds to a mixture of kernels of normal and compensating masks, i.e. the generation of a multi-optical system kernel. The pupil surface function on the graph of FIG. 8 may be regarded as the specified pupil surface function shown on the graph of FIG. 6, and the interpretation of this is similar to that of FIG. 6.

Figure 9A:
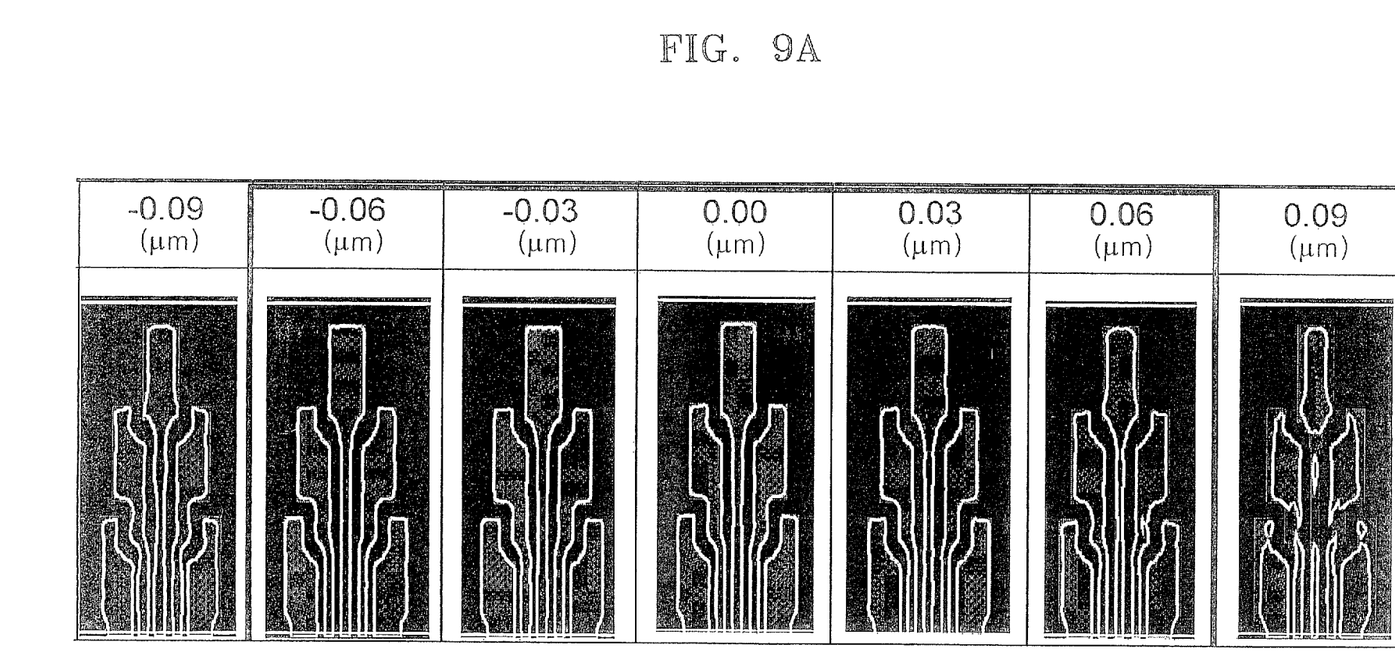
FIGS. 9A and 9B are photographs of pattern images of the multi-optical system of FIG. 7 and pattern images on a wafer.
Figure 9B:
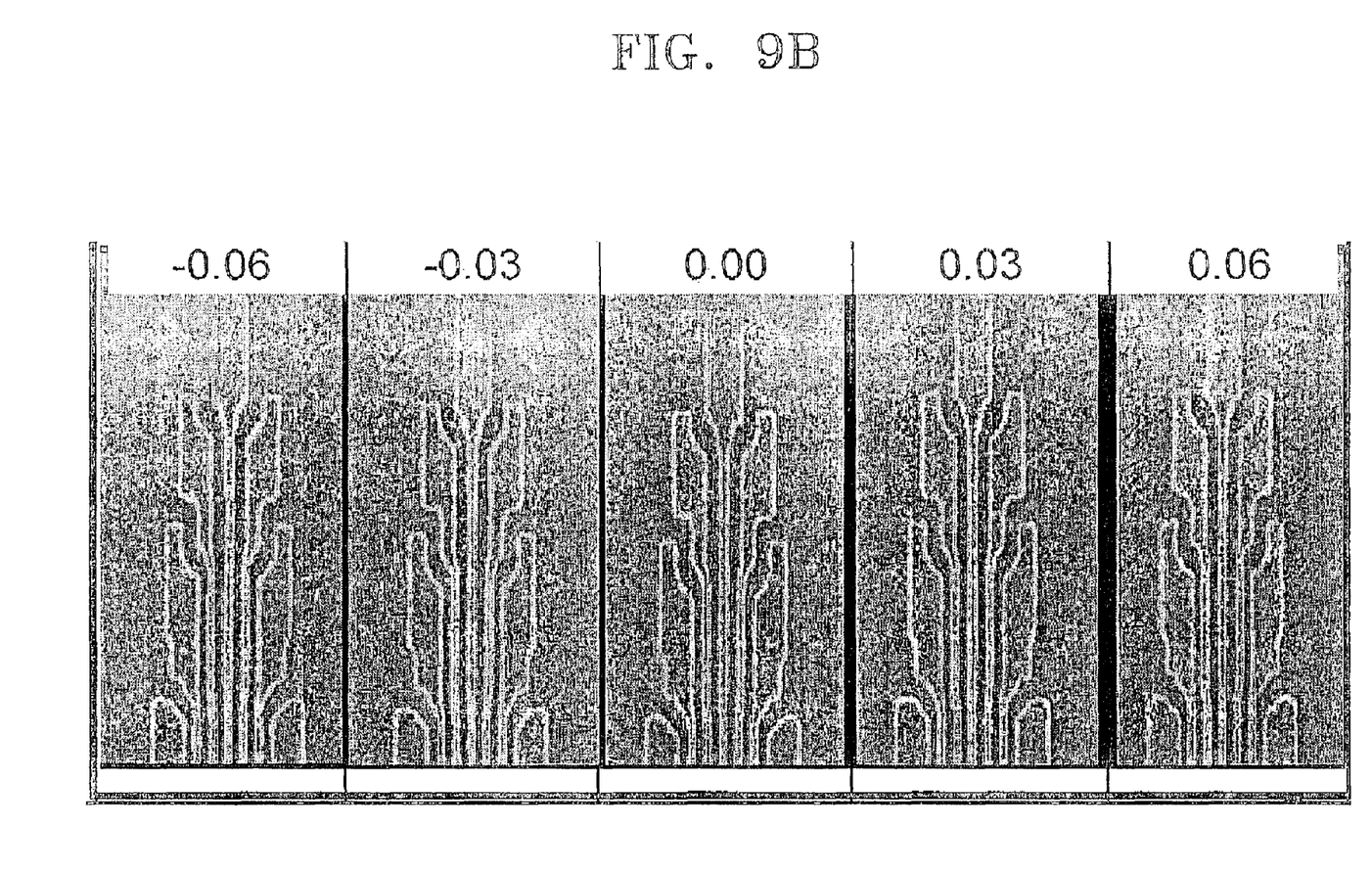

Reference is now made to FIGS. 9A and 9B, are photographs of pattern images of the multi-optical system of FIG. 7 adopting the compensating mask and pattern images on a wafer. FIG. 9A illustrates images of the multi-optical system (MOS). Not ee that the pattern images in a defocused state between ±0.06 μm are somewhat clear. FIG. 9B illustrates pattern images formed by applying an image of the multi-optical system to a wafer. Note that the pattern images are very clear. Additional calibration may be required to apply the multi-optical system in a defocused state. This may be performed after the multi-optical system kernel is generated. Thus, the method of compensating for a 3-D mask effect using a compensating mask allows a greater process margin and a pattern of a mask approximating a desired target can be generated.

Figure 10:
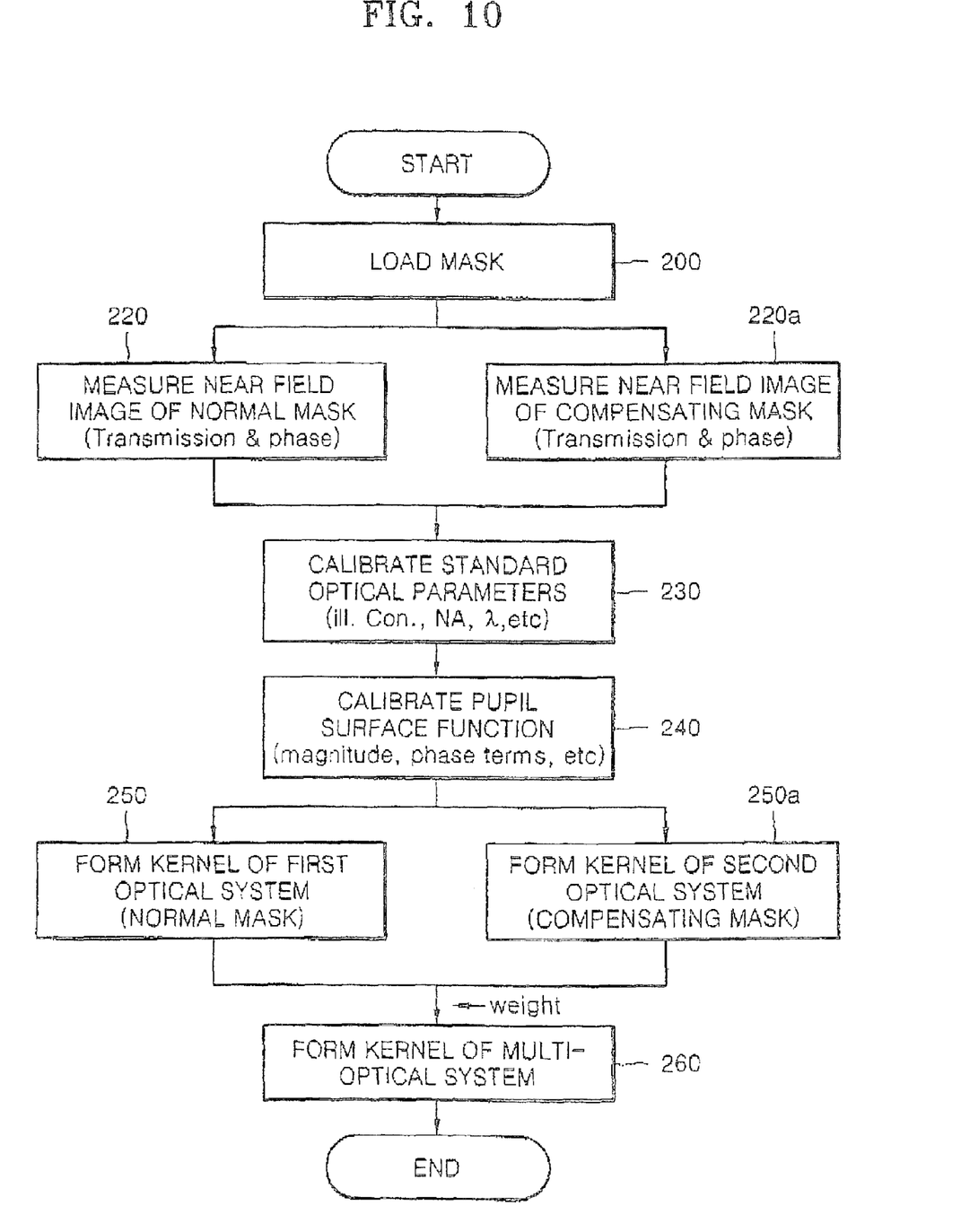
FIG. 10 is a flowchart illustrating operations for compensating for a 3-D mask effect using a compensating mask according to some embodiments of the present invention.

Reference is now made to FIG. 10, which is a flowchart of operations for compensating for a 3-D mask effect using a compensating mask according to some embodiments of the present invention. Referring to FIG. 10, a mask is loaded into an optical system (block 200). The mask may be a normal mask or a compensating mask. A near field image of the normal mask is measured (block 220). In some embodiments, the transmission and phase of the near field image of the normal mask may be measured. In some embodiments, the transmission and phase of the near field image of the compensating mask may be measured (block 220a). A standard optical parameter is calibrated (block 230). The calibrated standard optical parameter may be, for example, an illumination condition, an NA, a wavelength λ, and/or the like. In some embodiments, the degree of polarization (D.O.P.) may be considered.

A pupil surface function is calibrated (block 240). Magnitude, phase terms, etc. may be calibrated through the calibration of the pupil surface function. For example, the calibration of the magnitude, phase terms, etc. may be achieved through a diffraction order adjustment, E-field matching, etc. on a pupil surface. A kernel of the normal mask is generated (block 250). In some embodiments, an optical system to which the normal mask is applied may be referred to as a first optical system.

If the compensating mask is loaded into the optical system, a kernel of the compensating mask may be generated through the same process as that by which the kernel of the normal mask is generated (block 250a). An optical system to which the compensating mask is applied may referred to as a second optical system.

The kernels of the normal and compensating masks are mixed according to a weighting function to generate a multi-optical system kernel (block 260). An optical system to which normal and compensating masks are applied may be referred to as a multi-optical system. A kernel of the multi-optical system may be generated by calibrating a pupil surface function corresponding to a weighting function as described above.

A normal value may be substituted for a feature size of a mask, e.g., "2" is substituted for a feature size of 90 nm, and then applied to a wafer after the multi-optical system kernel is generated, to compare the result of the wafer with a target pattern specification. In this manner, the weighting function may be calibrated. As a result, the final multi-optical system kernel is completed. The calibration of the weighting function may be repeated several times to determine an accurate weighing function. If a kernel is suitable for a specification, an appropriate mask may be fabricated and then cast using photolithography.

In some embodiments, OPC may be performed before the multi-optical system kernel is generated. For example, in some embodiments, a 3-D mask effect of a mask may be automatically considered during performing the OPC.

In some embodiments, restrictions on a specific pattern of an applied wafer may be reflected on the kernel after the multi-optical system kernel is generated. Further, as described with reference to FIGS. 9A and 9B, calibration may be performed to apply the multi-optical system kernel in a defocused state.

In a multi-optical system using a compensating mask and a method of compensating for a 3-D mask effect using the compensating mask, when OPC is performed in consideration of the 3-D mask effect, the time required for performing OPC may be reduced. A compensating mask reflecting a specific pattern may be realized as a kernel. In some embodiments, a variation of a mask caused by a topography may be reflected in an optical system through the kernel to generate the multi-optical system kernel, which is a mixture of the kernels of the optical system and the compensating mask, and may approximate a thin mask. In this manner, OPC may automatically reflect a 3-D mask effect. As a result, the time required for performing OPC may be much less than when performing OPC through a conventional accurate simulation.

Figure 11:
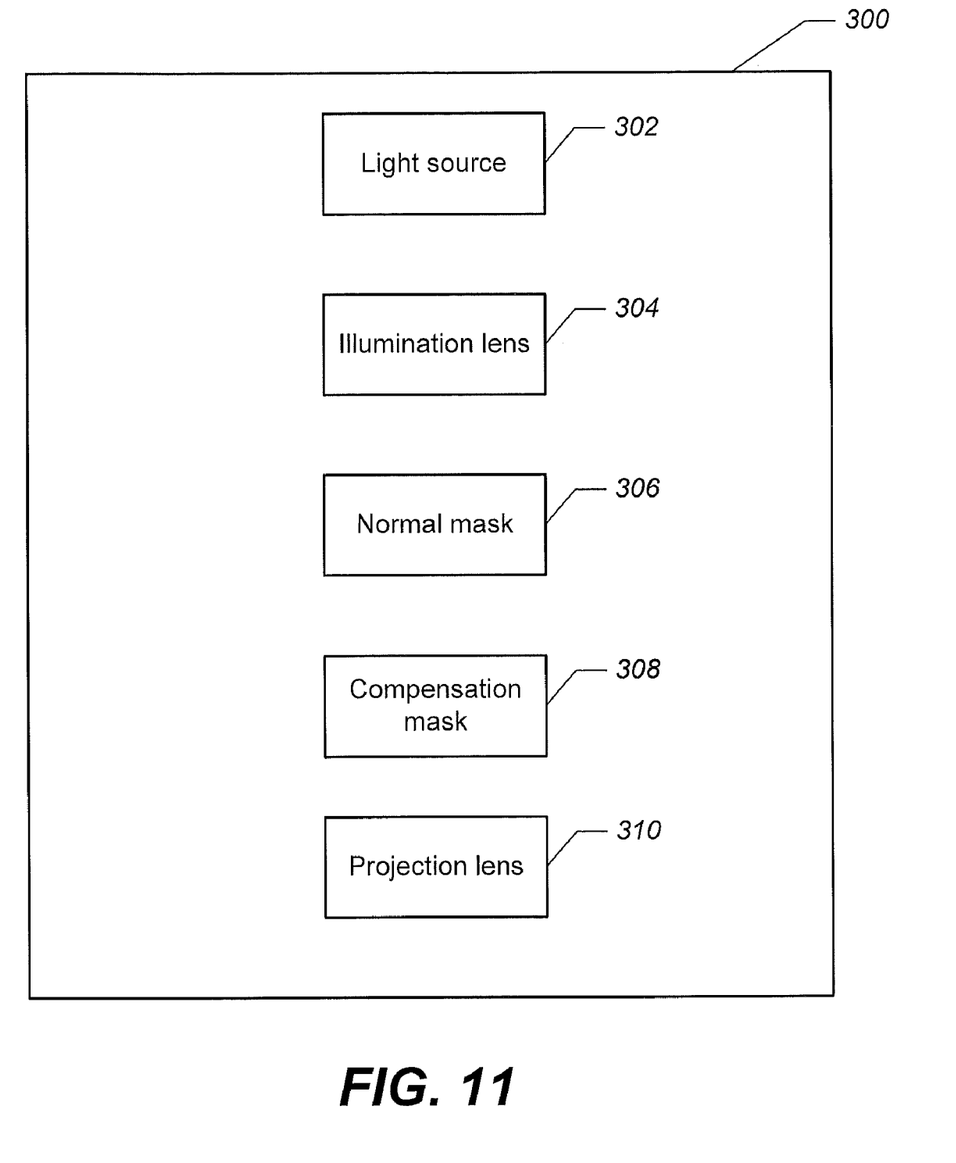
FIG. 11 is a block diagram illustrating a multi-optical system according to some embodiments of the present invention.

Reference is now made to FIG. 11, which is a block diagram illustrating a multi-optical system according to some embodiments of the present invention. The system 300 includes a light source 302 that is configured to irradiate light, an illumination lens 304 that is configured to calibrate the irradiated light, a normal mask 306 that is configured to transfer a predetermined minute pattern onto a wafer (not shown) via the calibrated light, a compensating mask 308 formed in a thin mask pattern to compensate for a 3-D effect caused by a thickness of the normal mask, the compensating mask comprising a light transmitting layer formed of a light transmitting material and a light blocking layer patterned underneath the light transmitting layer and formed of a light blocking material, and a projection lens 310 focusing the light transmitted through the mask onto the wafer.

As described above, a compensating mask according to the present invention may reduce a 3-D mask effect which may occur due to a reduction in a feature size of a mask. Thus, in a multi-optical system using the compensating mask and a method of compensating for a 3-D mask effect using the compensating mask, the 3-D mask effect may be diminished or eliminated. Additionally, the 3-D mask effect may be automatically considered when applying OPC. Thus, the time required for performing OPC may be much less than when performing OPC through an existing accurate simulation.

Additionally, conditions which may be suitable for a specific pattern and applied in a defocused state, can be reflected. Thus, a process margin may be further achieved. As a result, a high-quality mask pattern may be fabricated.

Although the present invention has been described in terms of specific embodiments, the present invention is not intended to be limited by the embodiments described herein. Thus, the scope may be determined by the following claims.

What is claimed is:

1. A method of compensating for a 3-D mask effect using a compensating mask, comprising:
   generating a first kernel corresponding to a normal mask used for forming a minute pattern;
   generating a second kernel corresponding to a compensating mask;
   mixing the first kernel corresponding to the normal mask with the second kernel corresponding to the compensating mask;
   generating a multi-optical system kernel corresponding to mixing the first kernel and the second kernel;
   calibrating standard optical parameters and a pupil surface function of a projection lens positioned under a mask of an optical system to generate the first kernel and the second kernel corresponding to the normal and the compensating masks, respectively; and
   forming the multi-optical system kernel according to a weighting function of the kernel of the compensating mask,
   wherein the weighting function expresses the extent to which the compensating mask is to be used to effectively exclude the 3-D mask effect.

2. The method of claim 1, further comprising applying the multi-optical system kernel on a wafer and comparing a result measured on the wafer a desired pattern specification to calibrate the weighting function.

3. The method of claim 1, wherein the weighting function corresponds to a scattering coefficient $\alpha$ of a near field image of the normal mask.

4. The method of claim 1, wherein generating the multi-optical system kernel comprises calibrating the pupil surface function according to the weighting function.

5. The method of claim 1, wherein generating the multi-optical system kernel comprises:
   inputting a predetermined value to the scattering coefficient a to obtain the weighting function;
   applying the weighting function to mix the first kernel corresponding to the normal with the second kernel corresponding to the compensating mask;
   applying the multi-optical system kernel on a wafer to measure a result;
   comparing the measured result with a desired pattern specification;
   calibrating the scattering coefficient $\alpha$ according to the comparison to obtain a new weighting function; and
   applying the new weighting function to mix the first kernel corresponding to the normal mask with the second kernel corresponding to the compensating mask.

* * * * *